(12) United States Patent
Cahill et al.

(10) Patent No.: US 10,340,209 B2
(45) Date of Patent: Jul. 2, 2019

(54) MIXED IMPEDANCE LEADS FOR DIE PACKAGES AND METHOD OF MAKING THE SAME

(71) Applicant: ROSENBERGER HOCHFREQUENZTECHNIK GMBH & CO. KG, Fridolfing (DE)

(72) Inventors: Sean S. Cahill, Santa Clara, CA (US); Eric A. Sanjuan, Santa Clara, CA (US)

(73) Assignee: Rosenberger Hochfrequenztechnik GmbH & Co. KG, Fridolfing (DE)

( * ) Notice: Subject to any disclaimer, the term of this patent is extended or adjusted under 35 U.S.C. 154(b) by 0 days.

(21) Appl. No.: 14/902,194

(22) PCT Filed: Jul. 2, 2014

(86) PCT No.: PCT/EP2014/001826
§ 371 (c)(1),
(2) Date: Dec. 30, 2015

(87) PCT Pub. No.: WO2015/000597
PCT Pub. Date: Jan. 8, 2015

(65) Prior Publication Data
US 2016/0372402 A1 Dec. 22, 2016

Related U.S. Application Data

(60) Provisional application No. 61/842,942, filed on Jul. 3, 2013.

(51) Int. Cl.
*H01L 23/49* (2006.01)
*H01L 23/495* (2006.01)
(Continued)

(52) U.S. Cl.
CPC .......... *H01L 23/4952* (2013.01); *H01L 23/66* (2013.01); *H01L 24/48* (2013.01);
(Continued)

(58) Field of Classification Search
CPC ....................................................... H01L 23/49
(Continued)

(56) References Cited

U.S. PATENT DOCUMENTS

| 2003/0159262 A1 | 8/2003 | Pasternak |
| 2009/0159320 A1* | 6/2009 | Sanjuan ................ H01L 23/047 |
| | | 174/260 |

(Continued)

FOREIGN PATENT DOCUMENTS

| JP | 05-267380 A | * 10/1993 |
| JP | H5-267380 A | 10/1993 |

(Continued)

*Primary Examiner* — Moazzam Hossain
*Assistant Examiner* — Hajar Kolahdouzan
(74) *Attorney, Agent, or Firm* — DeLio, Peterson & Curcio, LLC; Robert Curcio

(57) ABSTRACT

A die package having mixed impedance leads where a first lead has a first metal core, and a dielectric layer surrounding the first metal core, and a second lead has a second metal core, and a second dielectric layer surrounding the second metal core, with the dielectric thicknesses differing from each other. A method of making a die package having leads with different impedances formed by connecting the die package to the die substrate connection pads via a first wirebond having a first metal core, depositing a dielectric layer on the wirebond metal core, metalizing the dielectric layer, connecting the die package to the die substrate connection pads via a second wirebond having a second metal core, depositing a dielectric layer on the second wirebond second metal core, and metalizing the dielectric layer on the second metal core, such that the first wirebond has a different impedance than the second wire bond.

16 Claims, 8 Drawing Sheets

(51) Int. Cl.
*H01L 23/66* (2006.01)
*H01L 23/00* (2006.01)
*H01L 23/50* (2006.01)
*H01L 23/498* (2006.01)

(52) U.S. Cl.
CPC .............. *H01L 24/49* (2013.01); *H01L 24/85* (2013.01); *H01L 23/49861* (2013.01); *H01L 23/50* (2013.01); *H01L 24/45* (2013.01); *H01L 2223/6611* (2013.01); *H01L 2224/05554* (2013.01); *H01L 2224/45015* (2013.01); *H01L 2224/4569* (2013.01); *H01L 2224/45565* (2013.01); *H01L 2224/48011* (2013.01); *H01L 2224/48227* (2013.01); *H01L 2224/48247* (2013.01); *H01L 2224/4903* (2013.01); *H01L 2224/8501* (2013.01); *H01L 2224/8592* (2013.01); *H01L 2224/8593* (2013.01); *H01L 2224/85444* (2013.01); *H01L 2224/85931* (2013.01); *H01L 2924/00014* (2013.01); *H01L 2924/15311* (2013.01); *H01L 2924/181* (2013.01); *H01L 2924/30111* (2013.01)

(58) Field of Classification Search
USPC .......................................... 257/784; 438/763
See application file for complete search history.

(56) References Cited

U.S. PATENT DOCUMENTS

2009/0174072 A1\* 7/2009 Coates .............. H01L 23/49838
257/738
2010/0025864 A1\* 2/2010 Bailey ................. H01L 23/3121
257/784

FOREIGN PATENT DOCUMENTS

| JP | 2002-184934 A | 6/2002 |
| JP | 2008-227126 A | 9/2008 |
| KR | 100648841 | 11/2006 |
| KR | 1020080100032 | 11/2008 |
| KR | 1020110049753 | 5/2011 |
| TW | 201316477 A | 4/2013 |
| WO | 1992017905 A1 | 10/1992 |

\* cited by examiner

MIXED IMPEDANCE LEADS FOR DIE PACKAGES AND METHOD OF MAKING THE SAME

BACKGROUND OF THE INVENTION

1. Field of the Invention

The present invention relates to packaging suitable for die having inputs or outputs operating at frequencies up to the Gigahertz range, with leads having one or more distinct impedances, which allows for optimization for signal, power, or desired interconnect properties.

2. Description of Related Art

Electronic devices and components are operating at ever increasing speeds and over increasing frequency ranges. Popular semiconductor package types use wire bonds that can connect to a substrate or leadframe, which in turn can connect to second level interconnects, vias, substrate or package traces, solder balls, or the like, for connection to a printed circuit board (PCB) of an electronic device.

However, differing lead lengths can result in significant changes in impedance. This can include changes to series inductance. One solution is to partially compensate these lumped inductance changes with shunt capacitance, but such lumped structures tend to create non single-valued impedance behavior over frequency. Another solution is to attempt to select wire lengths that provide average impedance instead of optimized impedance. Unfortunately, this is difficult to achieve practically, and can result in poor performance for various connections that could benefit from impedance far from average.

SUMMARY OF THE INVENTION

Bearing in mind the problems and deficiencies of the prior art, it is therefore an object of the present invention to provide a die package with leads having one or more distinct impedances to optimize for signal, power, or desired interconnect properties.

It is another object of the present invention to provide a method of making a die package having leads with distinct impedances.

The above and other objects, which will be apparent to those skilled in the art, are achieved in the present invention which is directed to a die package comprising a die having a plurality of connection pads; a die substrate supporting a plurality of connection elements; a first lead having a first metal core with a first core diameter, and a dielectric layer surrounding the first metal core having a first dielectric thickness; and a second lead having a second metal core with a second core diameter, and a dielectric layer surrounding the second metal core having a second dielectric thickness, with the first dielectric thickness differing from the second dielectric thickness.

The claims dependent therefrom are directed to advantageous embodiments of the die package according to the invention.

A method of making a die package according to the invention includes the following steps: providing a die and a die substrate having connection pads; cleaning said connection pads; connecting said die to said die substrate connection pads via a first wirebond having a first diameter metal core; connecting said die to said die substrate connection pads via a second wirebond having a second diameter metal core; depositing at least one layer of dielectric on said wirebond first diameter metal core and on said wirebond second diameter metal core; and metalizing said at least one layer of dielectric on said first diameter metal core and on said second diameter metal core.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-8 of the drawings in which like numerals refer to like features of the invention.

Figure 1:
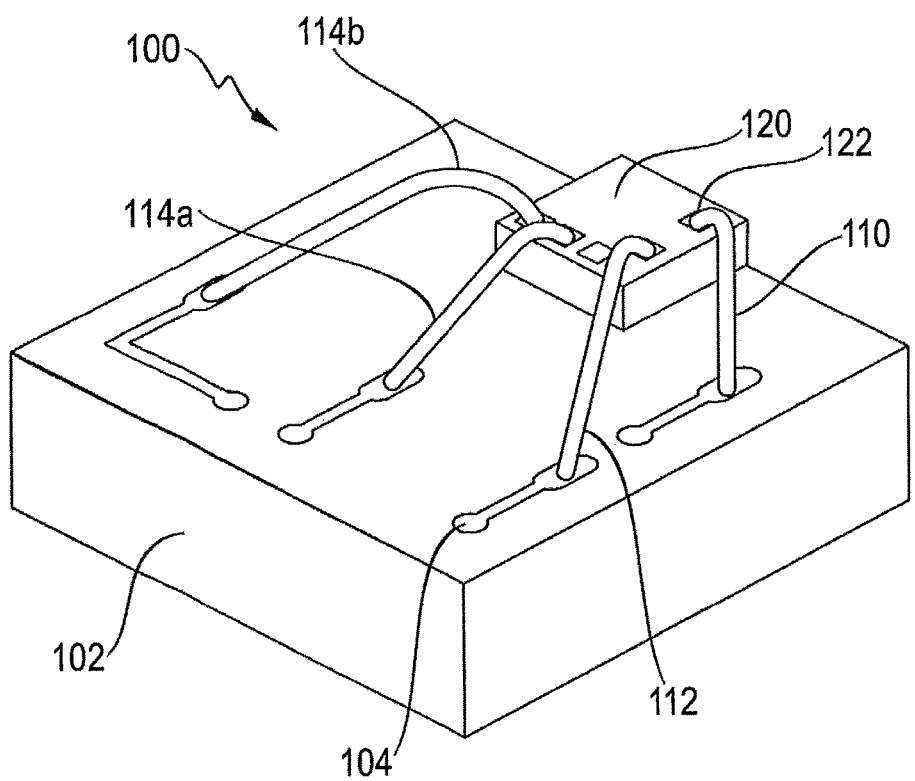
FIG. 1 is an illustration of dielectric and metal coated leads having multiple selected impedances, with one pair of leads having matched impedances despite having a differing length.
Figure 2:
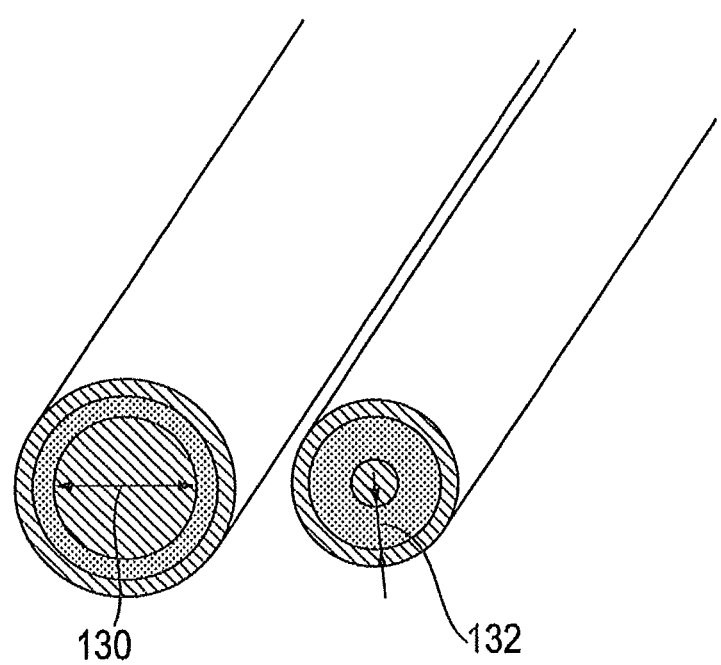
FIG. 2 illustrates two leads having both differing metal core diameter and dielectric thickness.

As seen in FIG. 1, a semiconductor die packaging system 100 can be formed to have leads 110, 112, and 114a,b that have varying dielectric thickness over an inner core and an outer metal layer (seen in more detail with respect to FIGS. 2 and 3). The die 120, mounted on die substrate 102, includes multiple connection pads 122 for signal, power, or other functionality required by the die 120. The die substrate can include conductive pads 104 that provide an electrically conductive path out of the package, directly, or through conductive leadframes, filled vias, conductive traces, second level interconnections, or the like. Leads 110, 112, and 114a,b connect to conductive pads 104, and as illustrated, may have substantially different lengths. In the illustrated embodiment, leads 110, 112, and 114a,b have distinctly different impedances because of differences in lead construction. For example leads 110 have a metal core of a defined diameter along its length, the metal core being sequentially coated with a thin dielectric layer and a conductive metal layer. Such leads 110 are suitable for transfer of power because the consequent low impedance and low capacitance reduces power sag. Alternatively, leads 112 have a much thicker dielectric layer suitable for transmission of signal data, while differing length leads 114a and 114b have a dielectric layer of intermediate thickness. In certain embodiments, due to the superior electrical characteristics of lead construction as disclosed, leads such as 114a and 114b having substantially different lengths but the same core diameter can have substantially the same impedance, within 10% of target impedance, despite having lengths that vary 50% or greater. In certain embodiments, lead differences can be even greater, with two leads having the same cross sectional structure and impedance, but one lead being as much as ten (10) times the length of the other.

Figure 3A:
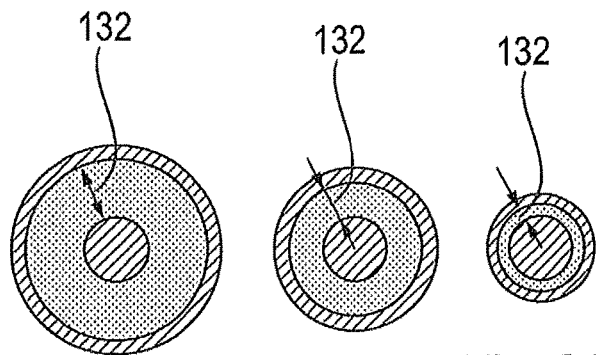
FIGS. 3A-C illustrate multiple possible variant leads having optimized or matched impedances.
Figure 3B:
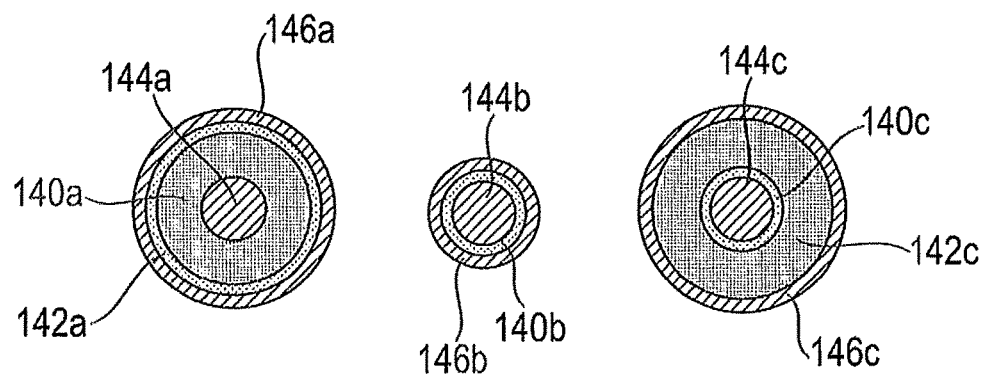
Figure 3C:
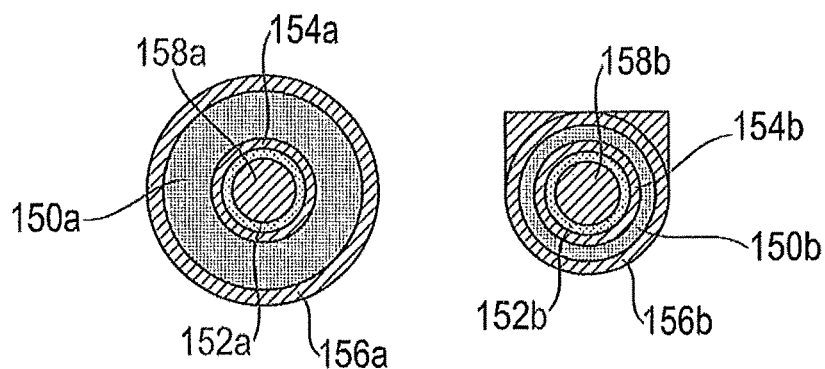

Lead construction is seen in more detail in FIGS. 2 and 3, which show, in cross section, dielectric coated leads used in semiconductor die packaging formed to have varying dielectric thickness 132. Thick, thin, and intermediate thicknesses are possible by varying dielectric coating times and manufacture steps. As can be seen in FIG. 2, both the core diameter 130 and the dielectric thickness 132 can be varied. This variation is also depicted in FIG. 3A. As seen in FIG. 3B, in certain embodiments the composition of the deposited dielectric can be varied, with for example distinct dielectric materials 140a,b,c and 142a,c surrounding a metal core 144a,b,c respectively, and in turn be surrounded by a respective ground connectable metal coating 146a,b,c. This allows, for example, a high performance dielectric having superior vapor barrier, oxygen degradation resistance, or the like, to be thinly deposited over a thick layer of a low cost dielectric material. In still other embodiments, as depicted in FIG. 3C, multiple layers of dielectric 150a,b and 152a,b, of varying thickness, surround core diameter 158a,b, respectively, and can be separated by thin metal layers 154a,b, with either or both metal layers 154a,b and 156a,b being connected to ground.

Generally, thin dielectric layers will provide low impedance good for power lines, thick dielectric layers are good for signal integrity, and outer metal layers are connected to same ground. A combination of core diameters and dielectric thicknesses is possible and a series of such steps may be performed to achieve more than two impedances. In certain embodiments it may be desirable to have large cores on power lines to increase power handling capacity, reduce power line temperatures, and/or further reduce any inductance on power supply and ground lines that would exacerbate ground bounce or power sag. Dielectric layers of intermediate thickness are also useful, since many packages could benefit from having leads of three (3) or more different dielectric thicknesses. For example, a lead having an intermediate dielectric thickness could be used to connect a source and load of substantially different impedance to maximize power transfer. In this manner, a 10 ohm source can be coupled to a 40 ohm load with a 20 ohm lead. Also, since cost of dielectric can be high, critical signal pathways can be interconnected using thick dielectric, with less critical status, reset, or the like leads coated with a dielectric layer having a thickness greater than the power leads, but less than (intermediate) to the critical signal leads. Advantageously, this can reduce dielectric deposition material cost and time.

The precise thickness of the dielectric coating may be chosen, in combination with the wirebond diameter, to achieve a particular desired impedance value for each lead.

$$Z_0 = \sqrt{\frac{L}{C}} = \frac{138}{\sqrt{\varepsilon_r}} \cdot \log\left(\frac{b}{a}\right) \quad (1)$$

The characteristic impedance of a coaxial line is given in Eq. (1), where L is the inductance per unit length, C is the capacitance per unit length, a is the diameter of the bond wire, b is the outside diameter of the dielectric, and $\varepsilon_r$ is relative permittivity of the coaxial dielectric.

Figure 4:
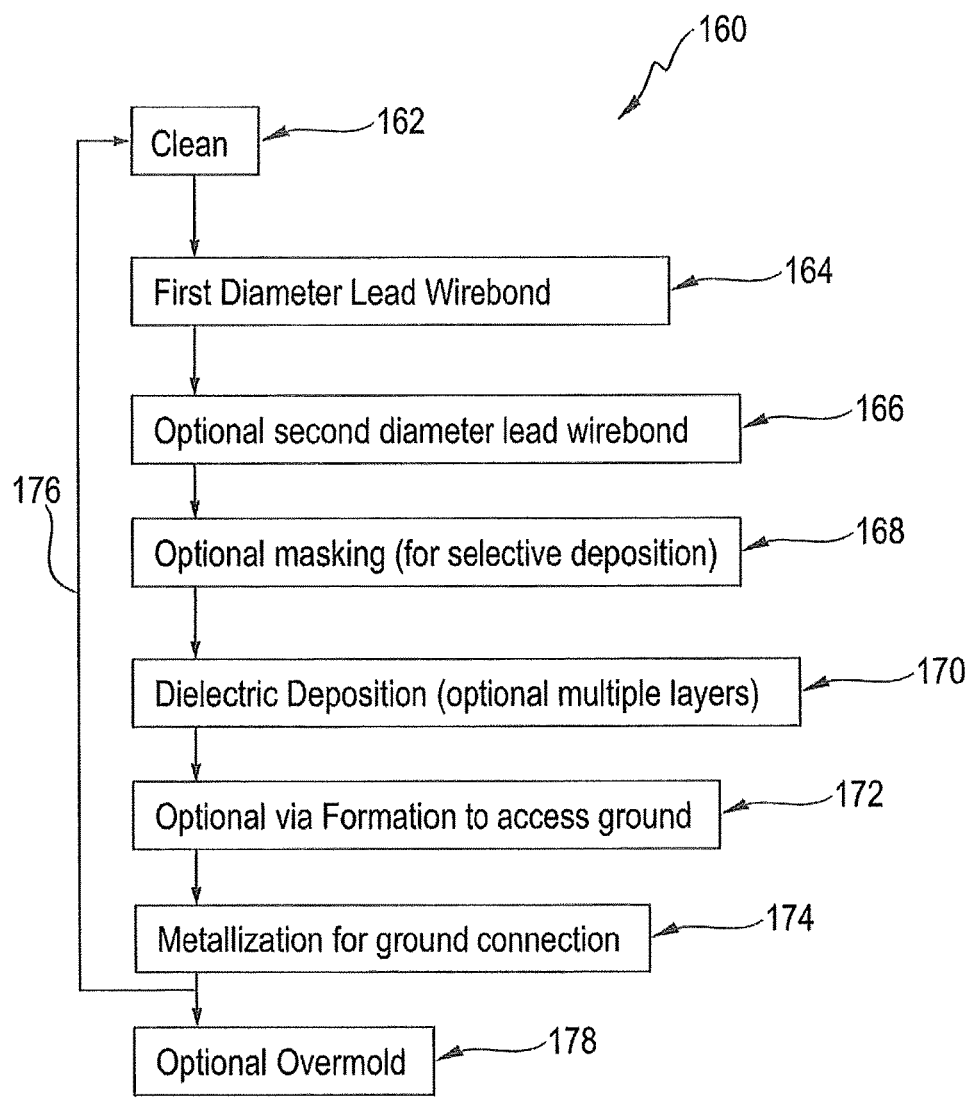
FIG. 4 illustrates a block diagram depicting method steps for manufacture of dielectric coated leads with outer ground connected metallization.
Figure 5:
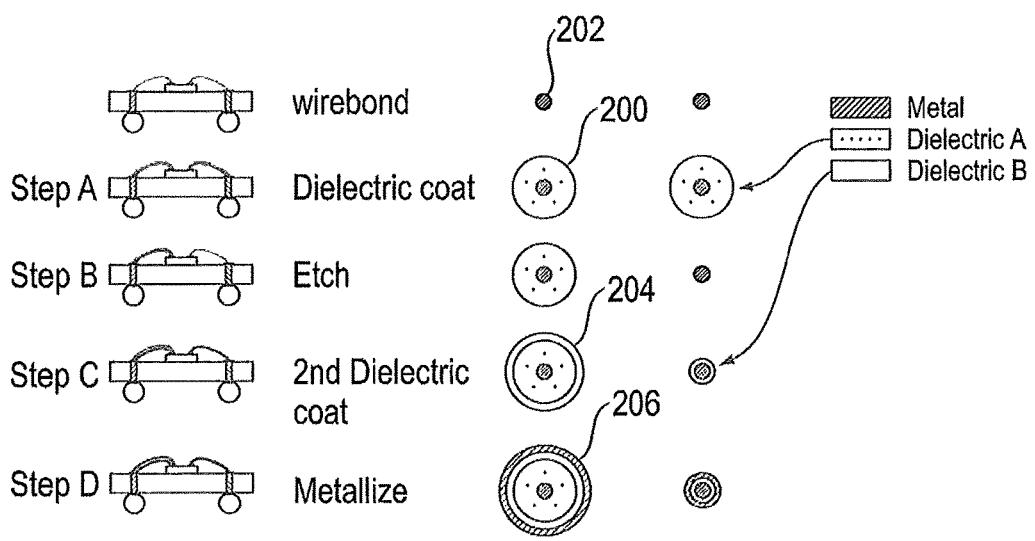
FIG. 5 illustrates a subtractive method for manufacture of dielectric coated leads with outer ground connected metallization.

As illustrated in FIG. 4, in one embodiment for the manufacture of dielectric coated leads with outer ground connected metallization can proceed using the steps illustrated in block diagram 160. In a first step 162, connection pads are cleaned on the die and the substrate. Next, a wirebond is used to connect the die to the connection pads 164. Optionally, a second diameter wire can be attached 166 (e.g. a larger diameter wire suitable for power connections), or areas of the die can be masked or otherwise protected to allow for selective deposition, step 168. One or more layers of dielectric of the same or different composition may be deposited (step 170), followed by selective laser or thermal ablation, or chemical removal of portions of the dielectric to allow access to ground connections (step 172) covered in the dielectric deposition step 170. This step is optional, since in some embodiments, the need for a ground via may be eliminated. This is particularly true for die operating at higher frequencies, since a virtual RF ground may be established through capacitive coupling. Metallization follows (step 174), covering the dielectric with a metal layer that forms the outermost metallized layer of the leads, and also connecting the leads to ground. The entire process can be repeated multiple times (step 176), useful for those embodiments using selective deposition techniques, and particularly for those embodiments supporting multiple die or complex and varied impedance leads. In the final step (step 178), for non-cavity packages, an overmold can be used to encapsulate leads. The encapsulated leads may be used in high frequency device packages described in U.S. Pat. No. 6,770,822 and in U.S. Pat. No. 8,839,508, the disclosures of which are fully incorporated by reference.

In certain embodiments, modifications and additions to the described process are possible. For example, providing conformal coatings of dielectric can be accomplished through a variety of methods using chemical (electrophoretic), mechanical (surface tension), catalytic primer, electromagnetic (UV, IR), electron beam, or other suitable techniques. Electrophoretic polymers are particularly advantageous because they can rely on self-limiting reactions that can deposit precise thicknesses readily by adjusting process parameters and or simple additive, concentration, chemical, thermal, or timing changes to an electrophoretic coating solution.

In other embodiments, dielectric pre-coated bondwires may be used to form leads. While commercially available coated wires typically are thinner in dielectric thickness than is necessary to create, for example, 50 ohm leads, the foregoing discussed dielectric deposition steps can be used to increase dielectric thickness to set the desired impedance. Use of these pre-coated wires can simplify other process steps necessary to create coaxial leads, and would allow for thinner layers of needed vapor deposited dielectrics and faster processing times to create ground vias. Pre-coated bondwires may be used to prevent shorting for narrowly spaced or crossing leads. In certain embodiments the pre-coated bondwire may have a dielectric made from a photosensitive material to allow for selective patterning techniques.

In other embodiments, the dielectric Parylene™ can be used. Parylene™ is the trade name for a variety of chemical vapor deposited poly(p-xylylene) polymers used as moisture and dielectric barriers. Parylene™ can be formed in a growth limited condensation reaction using a modified Parylene™ deposition system where the die, substrate, and leads are aligned to a photoplate which allows EM radiation (IR, UV or other) to strike in a precise manner causing selective growth rate of dielectric. Advantageously, this can minimize or eliminate the need for processes to create contact vias, bulk removal of Parylene™, etc.

Parylene™ and other dielectrics are known to suffer from degradation due to oxygen scission in the presence of oxygen, water vapor, and heat. Damage can be limited by metal layers that form excellent oxygen vapor barriers, with thin layers of 3-5 micron thickness capable of forming true hermetic interfaces. Alternatively, if metal has been selectively removed, or not deposited in certain areas due to electrical, thermal, or manufacturing requirements, a wide range of polymer based vapor oxygen barriers may be used, with polyvinyl alcohol (PVA) being one widely used polymer. These polymers can be glob topped, screen printed, stenciled, gantry dispensed, or sprayed on to the Parylene™ surface that will be exposed to the oxygen or water vapor environment. Advantageously, use of vapor barrier polymers can be a part of a cost reduction strategy, since thicker layers of high cost Parylene™ or other oxygen sensitive material might otherwise be required.

As will be appreciated, all of the described method steps can benefit from various selective deposition techniques. Selective deposition can be by physical masking, directed polymer deposition, photoresist methods, or any other suitable method for ensuring differential deposition thickness on the metal core, dielectric layer, or other outermost layer at time of deposition. While selective deposition allows for additive methods to build leads, it also allows for subtractive techniques in which dielectric or metal is removed to form interconnects of differing impedances. For example, a package populated by one or more die can be wire-bonded as appropriate for interconnect of all package and device pads. As seen with respect to FIG. 5, which illustrate steps and structures for manufacture of a die package, the dielectric coating 200 can be deposited to a predetermined thickness over a wirebond metal conductor 202 (step A), where the predetermined thickness of the dielectric is necessary for the secondary interconnect impedance. The secondary impedance wirebond dielectric can be removed for example by an etch step (step B), followed by a second coating 204 deposition (step C) followed by metallization 206 of both interconnects (step D). This subtractive process will create wirebonds of two distinct impedances.

Figure 6:
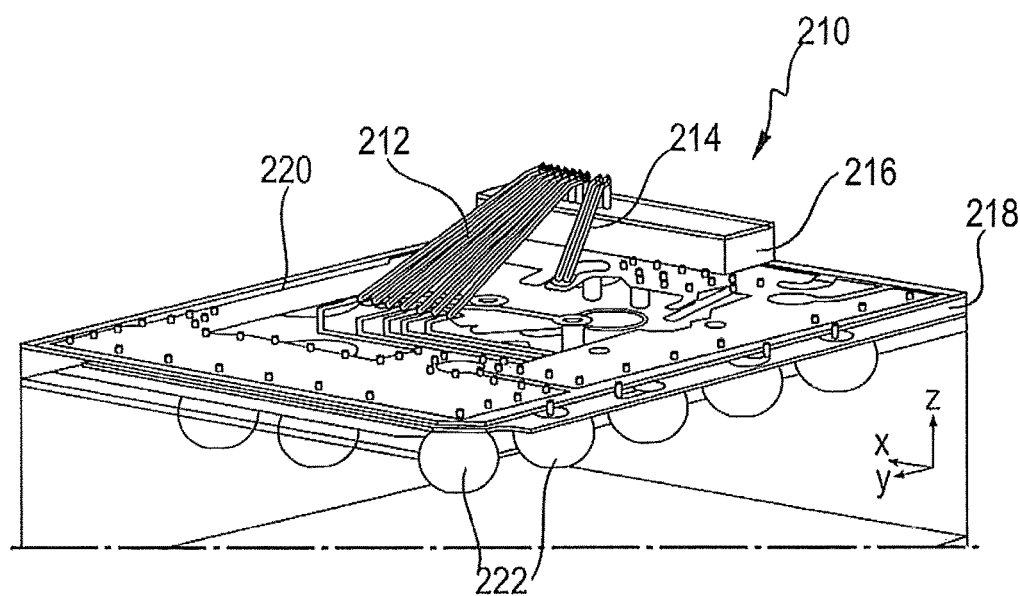
FIG. 6 illustrates a BGA package having dielectric coated leads with outer ground connected metallization.

In an embodiment illustrated with respect to FIG. 6, a ball grid array (BGA) package 210 that includes dielectric and metal coated leads 212, 214 having multiple selected impedances is described. A BGA is a surface-mount packaging widely used for integrated circuits, and can generally provide more interconnection pins than dual in-line, leadframe, or other flat package since the entire bottom surface of the BGA can be used for connection pads. In many types of BGA packages, a die 216 is attached to a substrate 218 having Tillable vias 220 connected to connection pads. Wirebonds 212, 214 can be used to connect the top side die 216 to the pads/vias 220, consequently providing electrical connections from a top side of the substrate to the bottom. In a BGA package, balls of solder 222 are attached to the bottom of the package and held in place with a tacky flux until soldering to a printed circuit board or other substrate. As described herein, the wirebonds of conventional BGA packages can be replaced with improved leads having a dielectric layer and an outer ground connectable metal layer. The leads can have varying dielectric thickness over an inner core and an outer metal layer, as well as being selectively optimized to have specific impedances, which can be selected to be different or well-matched based in part on dielectric layer thickness. As seen in FIG. 6, both long 212 and short leads 214 are supported.

In more detail, assembly of an improved BGA package may require face up attachment of a die to a substrate supporting a connection pad formed adjacent and around a via in the substrate. This assembly is wirebonded as appropriate for each required interconnect, with a wirebond formed between a connection pad on the substrate and a connection pad on the die. Low frequency and power inputs are connected to the low frequency signal leads, while high-frequency inputs and outputs are connected to the high frequency signal leads. In some embodiments, the low frequency and power inputs can have a thickness that differs from high frequency signal leads. The assembly is then subjected to the coating of any essentially conformal dielectric material. Because of its low cost, ease of vacuum deposition, and superior performance characteristics, Parylene™ is preferably used. A small part of the dielectric layer near the leadframe attachment point can be selectively removed by etch, thermal degradation, or laser ablation, in order to form electrical connection to a ground contact point or ground shield layer. Similarly, a small portion of the dielectric layer is removed near the die connection pads to permit ground connections. Connection to ground in the structure follows from application of a metallized layer over the top of the dielectric layer, forming a ground shield. The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings may help minimize cross-talk between leads. These coatings may be added in defined areas through a combination of lithography or other masking methods, and plating or other selective deposition methods. The package can be completed by placement of an overmold or lid over the die, followed by dicing (singulation) and testing.

Figure 7:
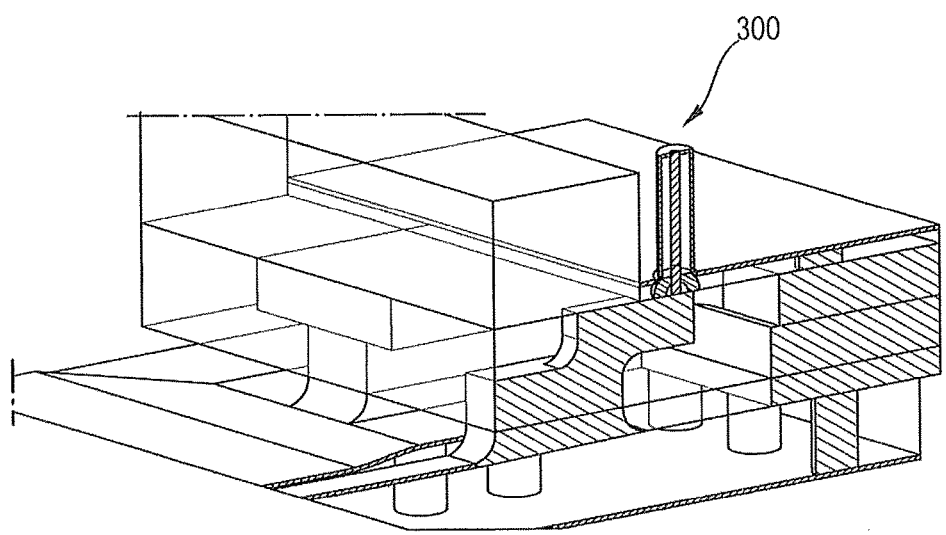
FIG. 7 illustrates a portion of leadframe package having dielectric coated leads with outer ground connected metallization.

Alternatively, in an embodiment illustrated with respect to FIG. 7, low cost leadframe based die package 300 including wire bonds extending from the die to a leadframe can be manufactured by forming a leadframe strip containing a two-dimensional array of individual package sites and outside frame portion. Leadframe fabrication is conventional, and can include formation of separate leads through etching, stamping, or electrode positioning. The leadframe strip can be placed in a mold including, but not limited to, an injection molding or transfer molding apparatus. An appropriate dielectric material, preferably plastic such as commercially available epoxy mold compound, is injected, pumped, or otherwise transferred into the mold to achieve a leadframe/mold material composite structure. The properties of the mold material are important for their dielectric constant, loss tangent, and electrically dispersive properties as well as their temperature, moisture, and other mechanical performance attributes.

Each package site on the resulting composite leadframe strip is cleaned of mold release material and or mold-flash, and prepared for deposition of a metal finish over the exposed metal portions of the leadframe. This may be accomplished through plating techniques such as immersion or electroplating, and the metals would be chosen for corrosion suppression and ease of wirebonding. An example of such finishing is a thin layer of nickel (for protection)

followed by a layer of gold (added protection and ability to wirebond). Each package site of the resultant molded leadframe strip can then be populated with the required die, which are attached to the base with die attach material being chosen for mechanical and thermal properties for a particular packaging application. The resultant assembly is then wirebonded as appropriate for each required interconnect, with a wirebond formed between a lead on the leadframe and a connection pad on the die. Low frequency and power inputs are connected to the low frequency signal leads, while high-frequency inputs and outputs are connected to the high frequency signal leads. In some embodiments, the low frequency and power inputs can have a thickness that differs from high frequency signal leads.

Like the foregoing described BGA package 210, the populated leadframe strip is then subjected to the coating of any essentially conformal dielectric material including Parylene™. In the case of Parylene™, it may be preferable to mask the bottom of the packages with tape, such as a vacuum-compatible polyimide with acrylic adhesive, or similar material to prevent deposition onto the area of the leads that will eventually be attached to the PCB. This will facilitate easier soldering at a subsequent step. A small part of the dielectric layer near the leadframe attachment point is selectively removed by etch, thermal degradation, or laser ablation, in order to form electrical connection to a ground contact point or ground shield layer. Similarly, a small portion of the dielectric layer is removed near the die connection pads to permit ground connections. Connection to ground in the structure follows from application of a metallized layer over the top of the dielectric layer, forming a ground shield. The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings can help minimize cross-talk between leads. These coatings may be added in defined areas through a combination of lithography or other masking methods, and plating or other selective deposition methods. The package is completed by placement of an overmold or lid over the die, followed by dicing (singulation) and testing.

Example 1—Impedance with Differing Metal Core Lead Diameter

For the Parylene™ C variety, the relative permittivity is approximately 2.73. For a desired 50 ohm impedance, the Parylene™ C deposit would be as indicated in Table 1 below:

TABLE 1

50 ohm coaxial lines

| wire diameter (mils) | dielectric diameter (mils) | dielectric deposition (μm) |
|---|---|---|
| 0.50 | 1.98 | 18.81 |
| 0.60 | 2.38 | 22.57 |
| 0.70 | 2.77 | 26.34 |
| 0.80 | 3.17 | 30.10 |
| 1.00 | 3.96 | 37.62 |

Typically, thinner wire bonds require thinner dielectric layers in order to achieve the same impedance. Or put differently, for a given dielectric layer thickness, different bond wire diameters will achieve different impedances. The chart below shows the impedance achieved for a dielectric thickness of 20 microns at different bond wire diameters:

TABLE 2

Coaxial lines with 20 micron Parylene™ C dielectric

| Characteristic Z (ohms) | wire diameter (mils) | dielectric diameter (mils) | dielectric deposition (μm) |
|---|---|---|---|
| 34.34 | 1.00 | 2.57 | 20.00 |
| 42.8 | 0.70 | 2.27 | 20.00 |
| 46.76 | 0.60 | 2.17 | 20.00 |
| 51.67 | 0.50 | 2.07 | 20.00 |

Example 2—Dual Impedance Package Using Same Metal Core Diameter Leads with Differing Dielectric Thickness Table 3 below shows impedance achieved for various dielectric thicknesses on 0.7 mil bond wires:

TABLE 3

Coaxial lines formed from 0.7 mil bond wire cores

| Characteristic Z (ohms) | wire diameter (mils) | dielectric diameter (mils) | dielectric deposition (ums) |
|---|---|---|---|
| 50 | 0.70 | 2.77 | 26.34 |
| 40 | 0.70 | 2.11 | 17.86 |
| 30 | 0.70 | 1.60 | 11.42 |
| 20 | 0.70 | 1.21 | 6.53 |
| 10 | 0.70 | 0.92 | 2.82 |
| 5 | 0.70 | 0.80 | 1.31 |

To manufacture a package having both 5 ohm impedance leads and 50 ohm impedance leads, a package populated by at least one die may be wire-bonded with 0.7 mil diameter wire as appropriate for a first layer of interconnect with eventual impedance of 50 ohms. The resultant package assembly is subjected to 25.03 (26.34-1.31) microns of coating with Parylene™ C dielectric. A laser process to open vias to power connections on the package and corresponding power connections on the device is performed along with any necessary cleaning steps. A subsequent wire-bonding process is carried out to make the power connections between corresponding device and package pads. The resultant assembly is then subjected to a second 1.31 micron Parylene™ C dielectric coating step. Thus, the initial power connection leads are coated with a total of 26.34 microns of dielectric, while the second-pass wires are coated with 1.31 microns of dielectric. The resultant assembly is then subjected to a laser via formation process to reveal ground pads on the device, the package, and/or the package ground planes.

The structure is metallized over the insulating layer to form a ground shield. The thickness of the preferred metal layer should be chosen in consideration of skin depth and DC resistance issues, and should be composed primarily of an excellent electrical conductor such as silver, copper, or gold, aluminum or other suitably conductive metal. For most applications, a 1 micron coating thickness is adequate for functionality, but thicker coatings can help minimize cross-talk between leads. These coatings may be added in defined areas through a combination of lithography or other masking methods, and plating or other selective deposition methods.

Example 3—Impedance Performance (as Measured by Insertion Loss)

Figure 8:
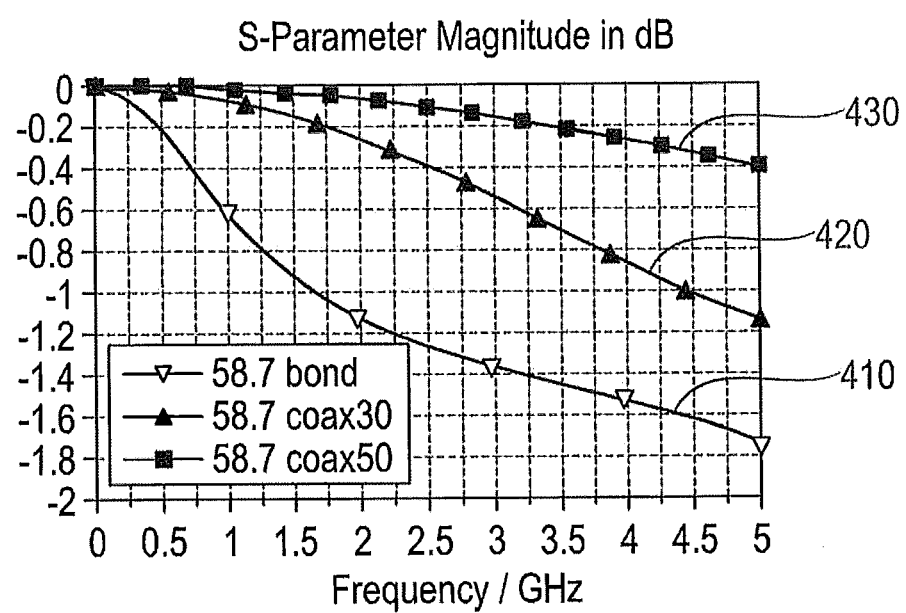
FIG. 8 illustrates frequency based loss differences among leads of various impedance values, including bare wire leads and dielectric coated leads with outer ground connected metallization.

FIG. 8 shows insertion loss comparison in dB over frequency as of bare bond 410, 30 ohm coax 420, and 50 ohm coax 430, as measured by an S-Parameter instrument over a frequency range from 0 to 5 GHz. Both matched (50 ohm) 430 and mismatched (30 ohm) 420 coax have superior performance to bare wire.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A die package comprising:
   a die having a plurality of connection pads;
   a die substrate supporting a plurality of connection elements;
   a first lead connected to at least one connection pad and having a first metal core with a first core diameter, and a dielectric layer surrounding the first metal core having a first dielectric thickness; and
   a second lead connected to at least one connection pad and having a second metal core with a second core diameter, and a dielectric layer surrounding the second metal core having a second dielectric thickness, with the first dielectric thickness differing from the second dielectric thickness,
   wherein the first lead has a first impedance and the second lead has a second impedance different from said first impedance, and
   wherein at least one of the dielectric layers includes multiple layers of different dielectric compositions including a vapor barrier layer deposited over a second dielectric layer and being thinner than the second dielectric layer.

2. The die package of claim 1, wherein the first metal core diameter differs from the second metal core diameter.

3. The die package of claim 2, wherein the first metal core is further connected to a first ground; and the second metal core is further connected to a second ground distinct from the first ground.

4. The die package of claim 1, wherein the first metal core diameter is the same as the second metal core diameter.

5. The die package of claim 1, wherein said die substrate includes filled via (220) to allow formation of a BGA package.

6. The die package of claim 1, wherein the die substrate includes a leadframe to form a leadframe package.

7. The die package of claim 1, wherein the first metal core is further connected to a first ground; and the second metal core is further connected to a second ground distinct from the first ground.

8. The die package of claim 7, wherein the dielectric layers are surrounded by a respective ground connectable metal coating.

9. The die package of claim 8, wherein said first metal core is sequentially coated with a dielectric layer and a first conductive metal layer and/or said second metal core is sequentially coated with a dielectric layer and a conductive metal layer.

10. The die package of claim 1, wherein the dielectric layers are surrounded by a respective ground connectable metal coating.

11. The die package of claim 1, wherein said first metal core is sequentially coated with a dielectric layer and a first conductive metal layer and/or said second metal core is sequentially coated with a dielectric layer and a conductive metal layer.

12. The die package of claim 11 wherein said first conductive metal layer is connected to a ground or zero potential contact point and/or said second conductive metal layer is connected to a ground or zero potential contact point.

13. The die package claim 1 including an overmold encapsulating said leads, or said die, or both.

14. A method of making a die package wherein said die package comprises:
   a die having a plurality of connection pads;
   a die substrate supporting a plurality of connection elements;
   a first lead connected to at least one connection pad and having a first metal core with a first core diameter, and a dielectric layer surrounding the first metal core having a first dielectric thickness; and
   a second lead connected to at least one connection pad and having a second metal core with a second core diameter, and a dielectric layer surrounding the second metal core having a second dielectric thickness, with the first dielectric thickness differing from the second dielectric thickness,
   wherein the first lead has a first impedance and the second lead has a second impedance different from said first impedance, and
   wherein at least one of the dielectric layers includes multiple layers of different dielectric compositions including a vapor barrier layer deposited over a second dielectric layer and being thinner than the second dielectric layer;
   said method comprising:
   providing a die and a die substrate having connection pads;
   connecting said die to said die substrate connection pads via a first wirebond having a first diameter metal core;
   connecting said die to said die substrate connection pads via a second wirebond having a second diameter metal core;
   depositing at least one layer of dielectric on said wirebond first diameter metal core and on said wirebond second diameter metal core, the dielectric thicknesses differing from each other; and
   metalizing said at least one layer of dielectric on said first diameter metal core and on said second diameter metal core, for creating two leads having different impedances, wherein said step of depositing at least one layer of dielectric includes depositing multiple layers of different dielectric compositions including said vapor barrier layer deposited over said second dielectric layer and being thinner than the second dielectric layer, on said first wirebond and/or on said second wirebond.

15. The method of claim 14 including masking areas of said die to allow for selective depositions.

16. The method of claim 14 including removing portions of said at least one layer of dielectric to allow access to ground.

* * * * *